[19] United States Patent
Kathawala et al.

(10) Patent No.: US 10,032,488 B1
(45) Date of Patent: Jul. 24, 2018

(54) SYSTEM AND METHOD OF MANAGING DATA IN A NON-VOLATILE MEMORY HAVING A STAGING SUB-DRIVE

(71) Applicant: SanDisk Technologies LLC, Plano, TX (US)

(72) Inventors: Gulzar A. Kathawala, Fremont, CA (US); Sergey Anatolievich Gorobets, Edinburgh (GB); Kroum S. Stoev, Pleasanton, CA (US); Jack Edward Frayer, Boulder Creek, CA (US); Liam Michael Parker, Edinburgh (GB)

(73) Assignee: SanDisk Technologies LLC, Plano, TX (US)

( * ) Notice: Subject to any disclaimer, the term of this patent is extended or adjusted under 35 U.S.C. 154(b) by 16 days.

(21) Appl. No.: 15/394,311

(22) Filed: Dec. 29, 2016

(51) Int. Cl.
*G11C 7/10* (2006.01)
*G11C 7/04* (2006.01)
*G06F 3/06* (2006.01)
*G06F 12/02* (2006.01)
*G11C 11/406* (2006.01)
*G11C 14/00* (2006.01)

(52) U.S. Cl.
CPC .............. *G11C 7/04* (2013.01); *G06F 3/0679* (2013.01); *G06F 12/0246* (2013.01); *G11C 11/406* (2013.01); *G11C 14/0054* (2013.01); *G06F 2212/1016* (2013.01); *G06F 2212/1041* (2013.01); *G06F 2212/1044* (2013.01); *G06F 2212/202* (2013.01); *G06F 2212/271* (2013.01); *G06F 2212/7202* (2013.01)

(58) Field of Classification Search
CPC ....... G11C 7/04; G11C 11/406; G06F 3/0679; G06F 12/0246

USPC ........ 365/189.011, 189.14, 230.03; 711/103, 711/114
See application file for complete search history.

(56) References Cited

U.S. PATENT DOCUMENTS

| 8,239,639 | B2 | 8/2012 | Sinclair |
| 8,261,009 | B2 | 9/2012 | Freikorn |
| 2012/0059978 | A1* | 3/2012 | Rosenband ........... G06F 3/0613 711/103 |

(Continued)

OTHER PUBLICATIONS

U.S. Appl. No. 15/087,104 entitled "Method and System for Managing Data in Non-Volatile Memory", filed Mar. 31, 2016.

*Primary Examiner* — Vu Le
(74) *Attorney, Agent, or Firm* — Brinks Gilson & Lione

(57) ABSTRACT

A system and method is disclosed for managing data in a non-volatile memory. The system may include a non-volatile memory having multiple non-volatile memory sub-drives, including a staging sub-drive to receive all data from a host and a plurality of other sub-drives each associated with a respective data temperature range. A controller of the memory system is configured to route all incoming host data only to the staging sub-drive and during garbage collection each individual piece of valid data from a selected source block in a selected source sub-drive is routed to a respective one of the sub-drives. The method may include only routing host data to the staging sub-drive and only relocating valid data to sub-drives other than the staging sub-drive based on a determined temperature of valid data and a unique temperature range associated with sub-drives other than the staging sub-drive in the non-volatile memory system.

21 Claims, 11 Drawing Sheets

(56) References Cited

U.S. PATENT DOCUMENTS

2012/0297122 A1 11/2012 Gorobets et al.
2013/0061019 A1 3/2013 Fitzpatrick et al.

* cited by examiner

SYSTEM AND METHOD OF MANAGING DATA IN A NON-VOLATILE MEMORY HAVING A STAGING SUB-DRIVE

BACKGROUND

Storage systems, such as solid state drives (SSDs) including NAND flash memory, are commonly used in electronic systems ranging from consumer products to enterprise-level computer systems. The market for SSDs has increased and its acceptance for use by private enterprises or government agencies to store data is becoming more widespread. SSDs and similar storage devices utilizing block-oriented architectures share a common issue: the need to create space for writing new data by collecting sparsely distributed data into a smaller number of blocks. This process is referred to as "garbage collection". The need for garbage collection in many block-oriented storage devices is generally due to the inability to write in place to memory, and the mismatch between write granularity and erase granularity in those storage devices.

The garbage collection process may introduce a significant burden on processing resources which, in turn, may reduce SSD performance. Garbage collection involves reading valid data from a block of non-volatile memory that is to be reused and writing it back to a new block. Many real-life data workloads, notably except uniform random and sequential, have different write densities for different logical areas, with some data being 'hot' or frequently written, and 'cold' or less frequently written. When data of different temperatures is mixed in the same blocks, the SSD can experience significant write amplification, where write amplification refers to the physical amount of data written or copied above the logical amount of data received.

DETAILED DESCRIPTION

Figure 1A:
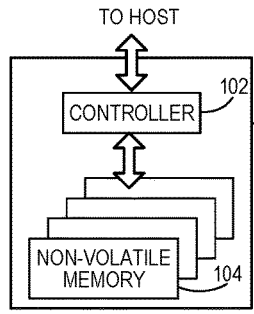
FIG. 1A is a block diagram of an example non-volatile memory system.

In order to address write amplification issues, and to reduce data management overhead burdens that can be created in addressing write amplification issues, a system and method for managing data in a non-volatile memory having a staging sub-drive is disclosed below.

According to one aspect, a method for managing data in a memory system having a controller in communication with a plurality of non-volatile memory sub-drives is disclosed. The method may include the controller receiving host data writes at the memory system and storing all data associated with the received host data writes only at a staging sub-drive of the plurality of sub-drives. The method may also include only moving data from the staging sub-drive to another sub-drive as part of a garbage collection operation to free additional space in the staging sub-drive.

In another aspect, a method for managing data is disclosed. The method includes, in a memory system having a controller and plurality of non-volatile memory sub-drives, including a staging sub-drive configured to receive all initial data writes from a host and plurality of additional sub-drives each associated with data of a different predetermined temperature range, the controller selecting one of the plurality of non-volatile memory sub-drives for a garbage collection operation. The controller may then select a source block for the garbage collection operation in the selected one of the plurality of sub-drives, where the selected source block has valid data pieces each associated with a respective logical address. The controller may then, for each valid data piece in the selected source block, determine a temperature of the logical address associated with the valid data piece and move the valid data piece to the non-volatile memory sub-drive containing data associated with logical addresses having the determined temperature.

In different implementations, selecting one of the plurality of non-volatile memory sub-drives may include selecting a sub-drive that exceeded a target overprovisioning threshold, where the target overprovisioning threshold comprises a predetermined ratio of free space in the sub-drive to the current amount of valid data in the sub-drive. Also, determining the temperature may include determining an amount of host activity previously directed to a logical address associated with the valid data piece.

In yet another aspect, a non-volatile memory system is disclosed. The non-volatile memory system includes a non-volatile memory having a plurality of sub-drives and a controller in communication with the plurality of sub-drives. The controller may be configured to only route data received from a host to a staging sub-drive. The controller may also be configured to select for a garbage collection operation from the plurality of sub-drives a sub-drive having more than a target amount of overprovisioning, where the target amount of overprovisioning is defined as the ratio of physical storage capacity to valid data based on a current amount of valid data. The controller may be configured to then select a source block from the selected sub-drive for the garbage collection operation and only relocate valid data pieces of the selected source block to sub-drives other than the staging sub-drive, where the relocation of each valid data piece is based on a data temperature range associated with the sub-drives other than the staging sub-drive and a data temperature determined for each valid data piece.

In another aspect, a non-volatile memory system is disclosed. The non-volatile memory system includes a non-volatile memory having a staging sub-drive configured to receive all host data from a host and a plurality of temperature range sub-drives other than the staging sub-drive, each of the plurality of temperature range sub-drives associated with a respective different data temperature range. The non-volatile memory also includes means for selecting a source block for a garbage collection operation from one of the staging sub-drive or plurality of temperature range sub-drives based on a target overprovisioning for each sub-drive and for only relocating valid data from the selected source block to sub-drives other than the staging sub-drive based on a data temperature range associated with the sub-drives other than the staging sub-drive and a data temperature determined for each valid data piece in the selected source block.

The logical address space of the non-volatile memory system may include logical block address (LBA) blocks of contiguous LBAs and a separate host activity counter associated with each LBA block that the controller increments to include all host activity counts of each LBA in the contiguous LBA range of a particular LBA block. The host activity tracked may be just host write activity directed to a LBA, or may be additional host activity such as host read commands including the LBA or other activities. The temperature of a piece of data associated with a specific LBA may be determined to be the average host activity per LBA in an LBA block calculated by dividing the total number of host activity hits stored in the counter for the LBA block by the number of LBAs encompassed by the LBA block.

Referring now to FIG. 1A, a block diagram illustrating a non-volatile memory system is shown. The non-volatile memory (NVM) system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, one or more microprocessors or processors (also referred to herein as central processing units (CPUs)), and a computer-readable medium that stores computer-readable program code (e.g., software or firmware) executable by the (micro)processors, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although in the example illustrated in FIG. 1A NVM system 100 includes a single channel between controller 102 and non-volatile memory die 104, the subject matter described herein is not limited to having a single memory channel. For example, in some NAND memory system architectures, such as in FIGS. 1B and 1C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
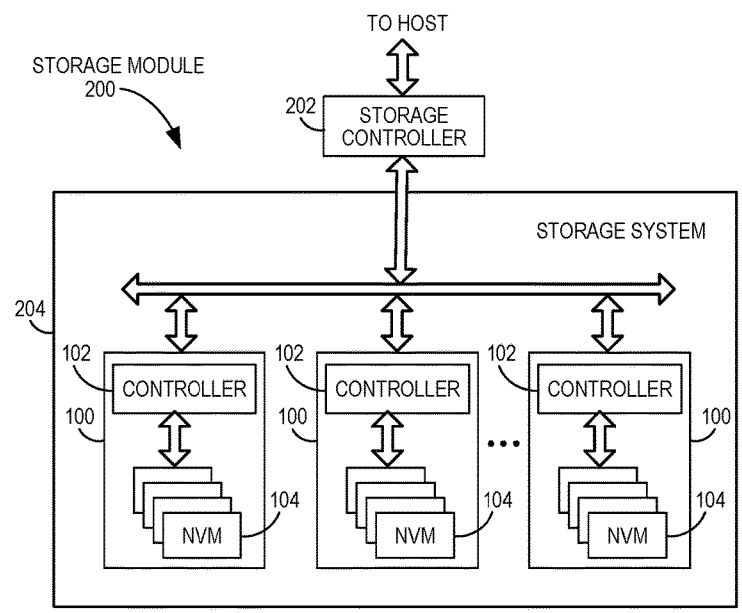
FIG. 1B is a block diagram illustrating an exemplary storage module.

FIG. 1B illustrates a storage module 200 that includes plural NVM systems 100. As such, storage module 200 may include a storage controller 202 that interfaces with a host and with storage system 204, which includes a plurality of NVM systems 100. The interface between storage controller 202 and NVM systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
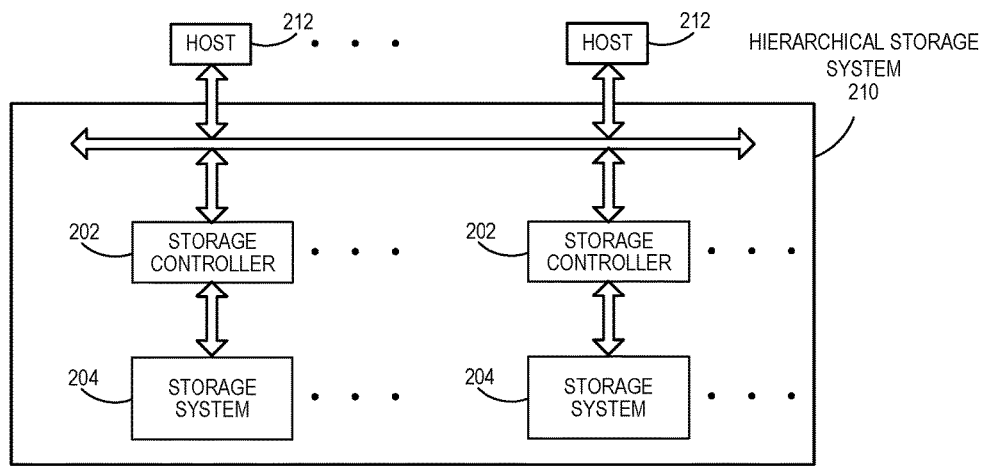
FIG. 1C is a block diagram illustrating a hierarchical storage system.

FIG. 1C is a block diagram illustrating a hierarchical storage system. A hierarchical storage system 210 includes a plurality of storage controllers 202, each of which controls a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
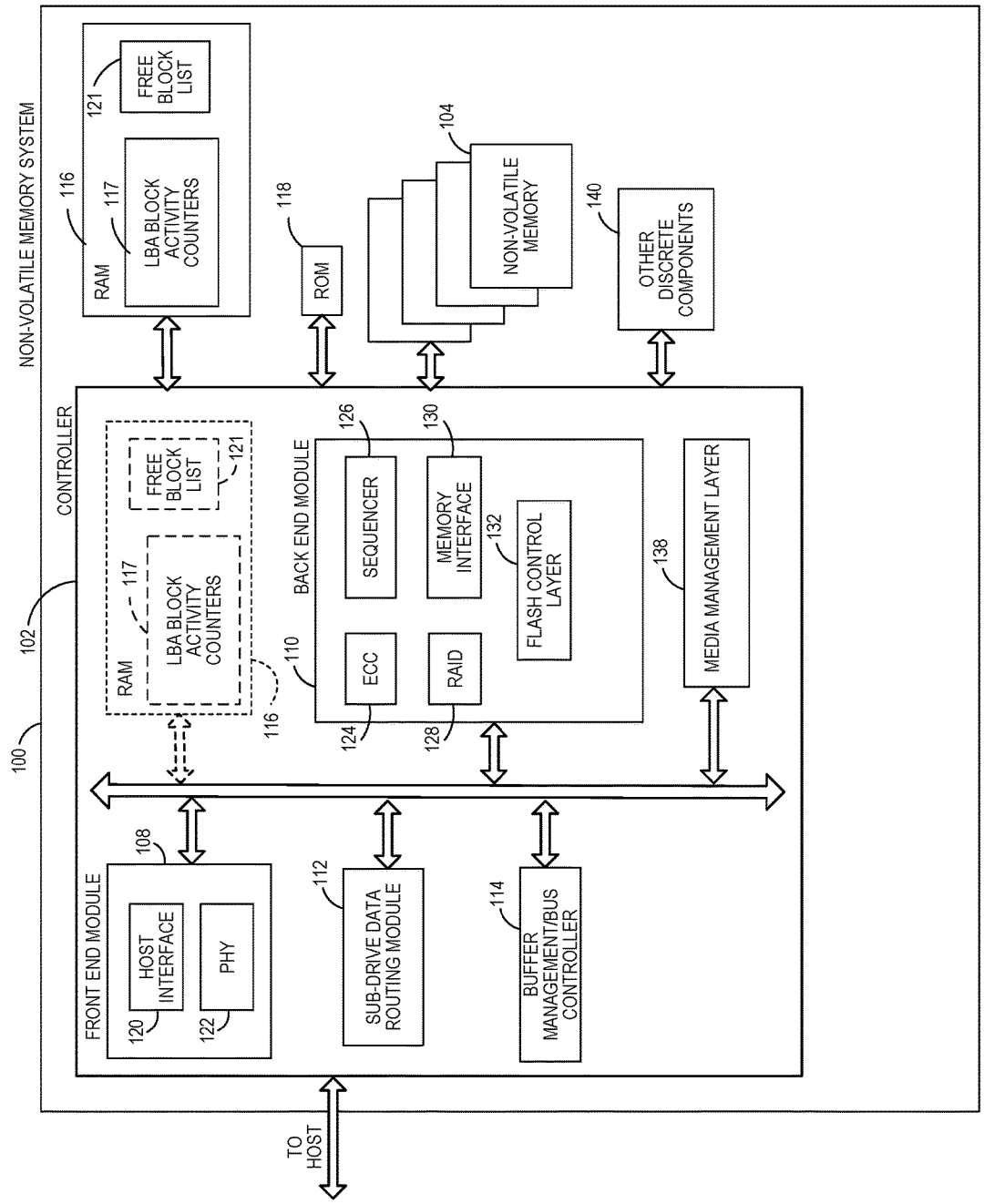
FIG. 2A is a block diagram illustrating exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 102 may include a sub-drive data routing module 112 present on the die of the controller 102. As described below, the sub-drive data routing module 112 may provide functionality for routing data from a host only to a particular portion of non-volatile memory 104 and for moving data at predetermined times between various portions of the non-volatile memory 104 based on a frequency of host activity regarding the data. The sub-drive data routing module 112 of the controller 102 may accomplish this by tracking activity (e.g. the number of host writes or the number of host reads) to individual logical block addresses (LBAs) in predefined sections of contiguous LBAs, referred to herein as LBA blocks, in the logical address space. The sub-drive data routing module 112 may then assign an average activity count, also referred to herein as temperature, to all the LBAs included in that particular LBA block and, upon initiation of a garbage collection operation in a sub-drive, move data associated with a particular LBA to a physical block in the same or another sub-drive based on the temperature associated with that LBA. The sub-drive data routing module 112 may also manage sub-drives differently in the NVM system 100 such that only one sub-drive includes an open host write block, thus is the only sub-drive accepting host data from the host. Also, all other sub-drives, except for the single sub-drive that accepts host data, include open relocation blocks for accepting data relocated from a garbage collection operation. In other words, in one implementation all data from the host must always first go to the single sub-drive dedicated to receive host data and all other sub-drives only receive relocated data from each other or the single dedicated sub-drive (referred to herein as a staging sub-drive).

A buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller 102. In yet other embodiments, portions of RAM 116 and ROM 118 may be located both within the controller 102 and outside the controller. Further, in some implementations, the controller 102, RAM 116, and ROM 118 may be located on separate semiconductor die.

The RAM 116 in the NVM system 100, whether outside the controller 102, inside the controller or present both outside and inside the controller 102, may contain a number of items, including a copy of one or more pieces of the logical-to-physical mapping tables for the NVM system 100. The RAM 116 may contain LBA activity counters 117 for each of the LBA blocks of non-volatile memory. The RAM 116 may also include a free block list 121 indicating currently unused physical blocks available for use in the non-volatile memory 104.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the NVM system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of NVM system 100 illustrated in FIG. 2A include the media management layer 138, which performs wear leveling of memory cells of non-volatile memory die 104 and manages mapping tables and logical-to-physical mapping or reading tasks. NVM system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
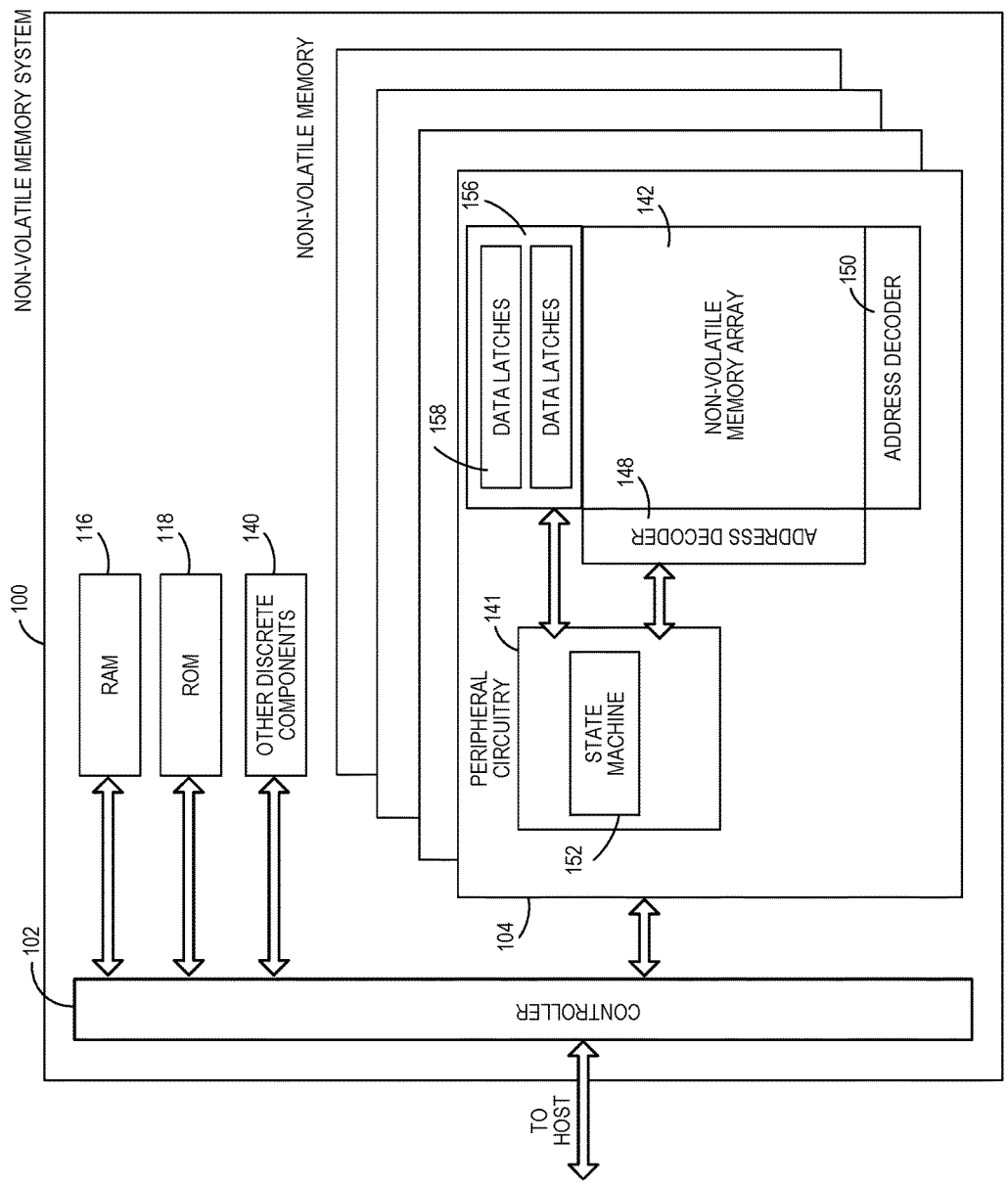
FIG. 2B is a block diagram illustrating exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two-dimensional and/or three-dimensional configuration. Peripheral circuitry 141 includes a state machine 152 that provides status information to controller 102. Non-volatile memory die 104 further includes a data cache 156 that caches data being read from or programmed into the non-volatile memory cells of the non-volatile memory array 142.

The data cache 156 comprises sets of data latches 158 for each bit of data in a memory page of the non-volatile memory array 142. Thus, each set of data latches 158 may be a page in width and a plurality of sets of data latches 158 may be included in the data cache 156. For example, for a non-volatile memory array 142 arranged to store n bits per page, each set of data latches 158 may include N data latches where each data latch can store 1 bit of data.

In one implementation, an individual data latch may be a circuit that has two stable states and can store 1 bit of data, such as a set/reset, or SR, latch constructed from NAND gates. The data latches 158 may function as a type of volatile memory that only retains data while powered on. Any of a number of known types of data latch circuits may be used for the data latches in each set of data latches 158. Each non-volatile memory die 104 may have its own sets of data latches 158 and a non-volatile memory array 142. Peripheral circuitry 141 includes a state machine 152 that provides status information to controller 102. Peripheral circuitry 141 may also include additional input/output circuitry that may be used by the controller 102 to transfer data to and from the latches 158, as well as an array of sense modules operating in parallel to sense the current in each non-volatile memory cell of a page of memory cells in the non-volatile memory array 142. Each sense module may include a sense amplifier to detect whether a conduction current of a memory cell in communication with a respective sense module is above or below a reference level.

Figure 3:
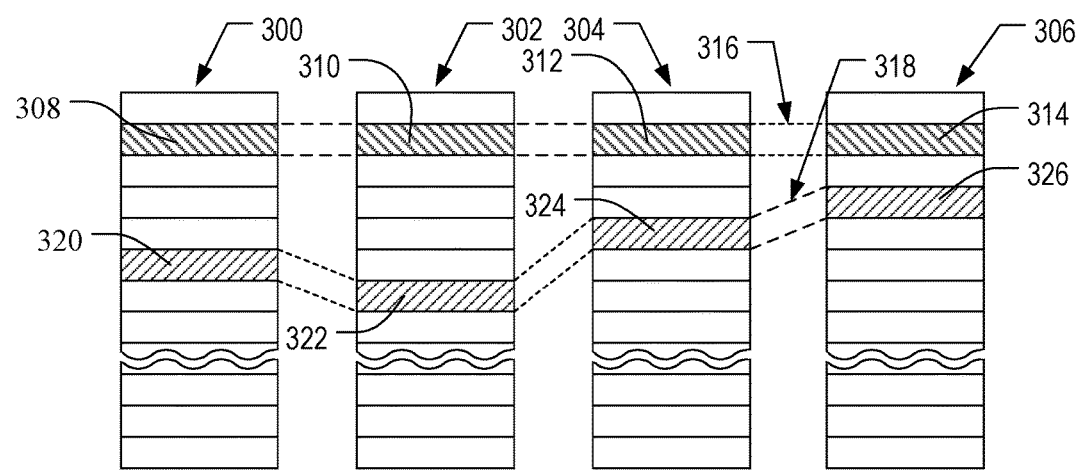
FIG. 3 illustrates an example physical memory organization of the non-volatile memory system of FIG. 1A.

The non-volatile flash memory array 142 in the non-volatile memory 104 may be arranged in blocks of memory cells. A block of memory cells is the unit of erase, i.e., the smallest number of memory cells that are physically erasable together. For increased parallelism, however, the blocks may be operated in larger metablock units. One block from each of at least two planes of memory cells may be logically linked together to form a metablock. Referring to FIG. 3, a conceptual illustration of a representative flash memory cell array is shown. Four planes or sub-arrays 300, 302, 304 and 306 of memory cells may be on a single integrated memory cell chip, on two chips (two of the planes on each chip) or on four separate chips. The specific arrangement is not important to the discussion below and other numbers of planes may exist in a system. The planes are individually divided into blocks of memory cells shown in FIG. 3 by rectangles, such as blocks 308, 310, 312 and 314, located in respective planes 300, 302, 304 and 306. There may be dozens or hundreds of blocks in each plane. Blocks may be logically linked together to form a metablock that may be erased as a single unit. For example, blocks 308, 310, 312 and 314 may form a first metablock 316. The blocks used to form a metablock need not be restricted to the same relative locations within their respective planes, as is shown in the second metablock 318 made up of blocks 320, 322, 324 and 326.

Figure 4:
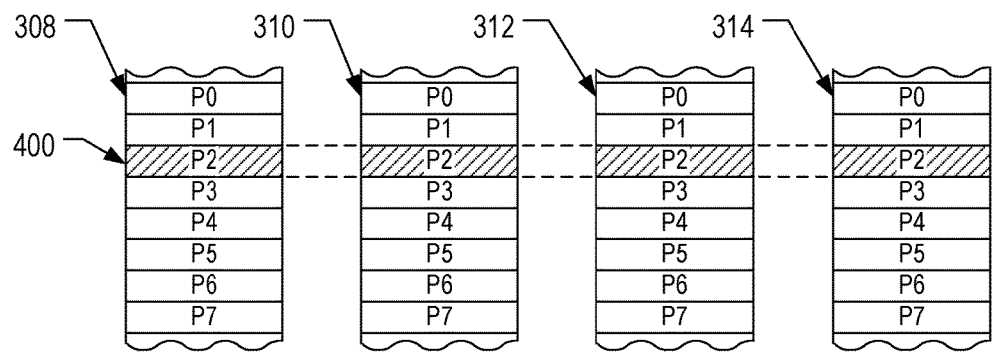
FIG. 4 shows an expanded view of a portion of the physical memory of FIG. 3.

The individual blocks are in turn divided for operational purposes into pages of memory cells, as illustrated in FIG. 4. The memory cells of each of blocks 308, 310, 312 and 314, for example, are each divided into eight pages P0-P7. Alternately, there may be 16, 32 or more pages of memory cells within each block. A page is the unit of data programming within a block, containing the minimum amount of data that are programmed at one time. The minimum unit of data that can be read at one time may be less than a page. A metapage 400 is illustrated in FIG. 4 as formed of one physical page for each of the four blocks 308, 310, 312 and 314. The metapage 400 includes the page P2 in each of the four blocks but the pages of a metapage need not necessarily have the same relative position within each of the blocks. A metapage is typically the maximum unit of programming, although larger groupings may be programmed. The blocks disclosed in FIGS. 3-4 are referred to herein as physical blocks because they relate to groups of physical memory cells as discussed above. As used herein, a logical block is a virtual unit of address space defined to have the same size as a physical block. Each logical block may include a range of logical block addresses (LBAs) that are associated with data received from a host. The LBAs are then mapped to one or more physical blocks in the non-volatile memory system 100 where the data is physically stored.

The term superblock may be used interchangeably with the term metablock herein. A superblock is a metablock that assigns one of the constituent blocks to contain exclusively metadata regarding parity information for all of the remaining constituent blocks of the metablock. For example, each page of the designated parity block of a superblock may contain exclusive (XOR) data of the user data in a page of the remaining blocks of the superblock. The block in the superblock designated to contain parity data is typically the last block, but any block may be used in other implementations. Additionally, a superblock may span multiple dies, for example as many as 64 dies or higher.

Figure 5:
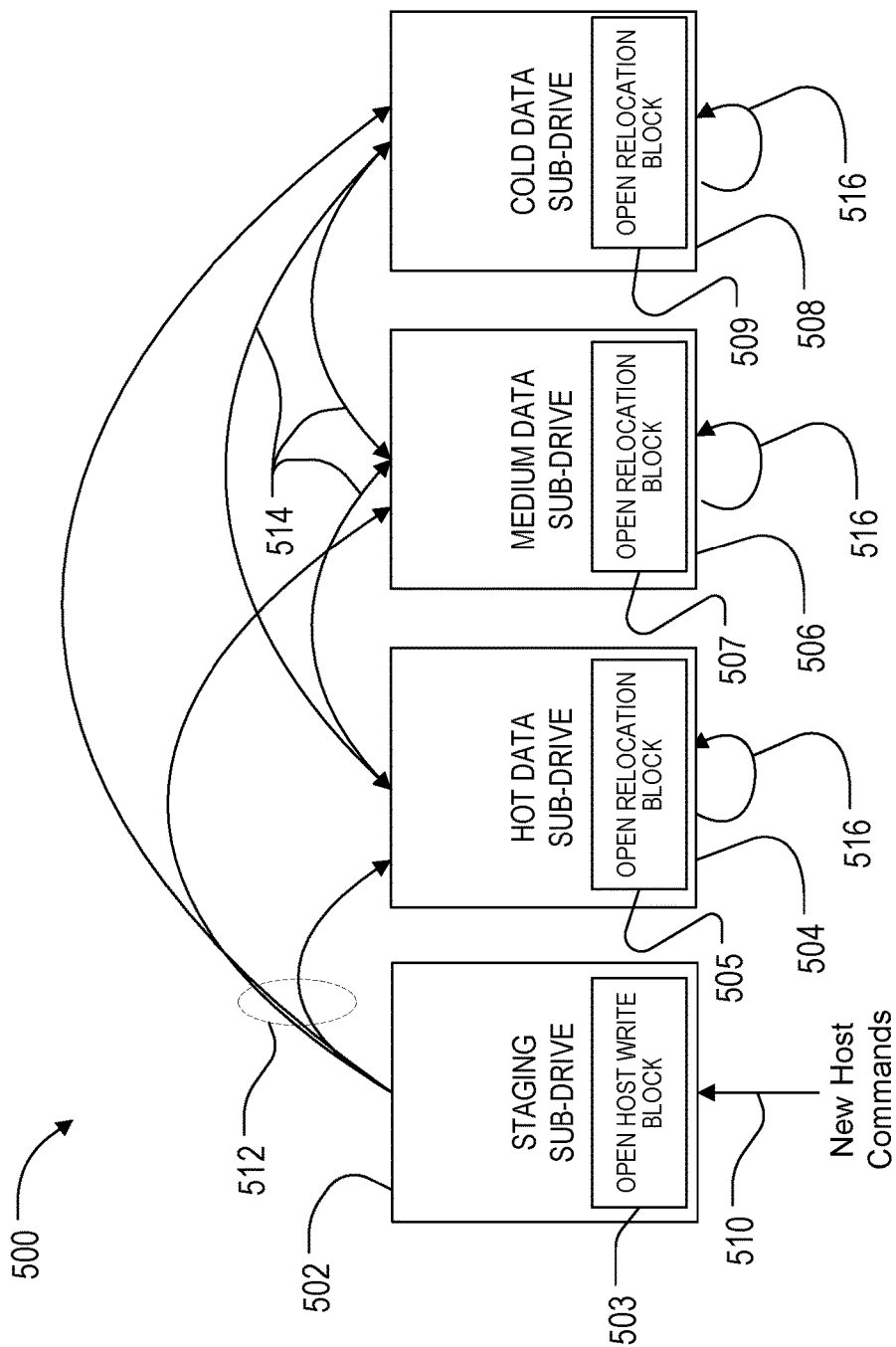
FIG. 5 illustrates a block diagram of the non-volatile memory of FIG. 2A divided in to multiple sub-drives.

In FIG. 5, a conceptual illustration of the non-volatile memory 500 (corresponding to non-volatile memory 104 in FIGS. 2A-2B) is shown. The non-volatile memory 500 is divided into sub-drives for storing data, including a staging sub-drive 502 and three additional sub-drives 504, 506, 508 configured to store data associated with LBAs determined to have particular "temperatures." Only the staging sub-drive is shown with an open host write block 503 because, in one implementation, all host data writes are directed exclusively to the staging sub-drive 502. The controller 102 routes data being relocated in the non-volatile memory system 100 only to the other sub-drives and so no open relocation block is maintained in the staging sub-drive.

As noted previously and described in greater detail below, the temperature of a given LBA refers to the frequency of host activity regarding the LBA associated with the data where, in one implementation, host activity refers only to host write operations. Although in other implementations the host read operations to may also be considered as host activity, the discussion herein focuses on write activity as tracking and utilizing write activity may provide desired write amplification benefits. The data is sorted into sub-drives each associated with a particular temperature threshold or range. The additional sub-drives 504, 506, 508 shown in FIG. 5 include a hot data sub-drive 504, a medium data sub-drive 506 and a cold data sub-drive 508, where the hot data sub-drive 504 is configured to contain only data associated with LBAs having a high frequency of host activity, the medium data sub-drive 506 is configured to store data associated with LBAs of an intermediate level of host activity that is less than that of the host data sub-drive 504, and the cold data sub-drive 508 is configured it contain data associated with LBAs having infrequent host activity (less than the activity found in the intermediate data sub-drive 506). The hot data, medium data and cold data sub-drives only accept data writes of relocated data, and not host data writes, and therefore only these sub-drives are shown with open relocation blocks 505, 507, 509 and no open host write block. Although three sub-drives having data temperature associations are illustrated, any number of two or more sub-drives associated with respective temperature ranges are contemplated to allow for different granularity of data sorting by determined data temperature.

Each of the sub-drives 502-508 is a collection of superblocks that are managed together. There may be greater than or fewer than the number of sub-drives shown in FIG. 5 in different implementations. Also, each of the sub-drives 502-508 may exist in separate non-volatile memory die 104, the same non-volatile memory die, or each straddle multiple non-volatile memory die 104 in the non-volatile memory system 100. Each sub-drive may include only one type of memory cell, such as SLC or MLC, or multiple types of memory cells.

The routing of data from the host to and between sub-drives is managed by the sub-drive data routing module 112 in the controller 102. A feature of the present system and method is that the sub-drive data routing module 112 is configured such that all data coming from a host into the non-volatile memory 500 is only sent to the staging sub-drive 502. Regardless of the determined temperature of particular LBAs of incoming data, all data being received from the host is written to the staging sub-drive and is not moved from the staging sub-drive 502 unless a garbage collection operation is needed in the staging sub-drive 502. Also, the sub-drive data routing module 112 is configured such that, if a garbage collection operation becomes necessary in any of the other sub-drives 504-508, the valid data from the identified source superblock may only be moved to a relocation superblock in the same sub-drive or to another of the sub-drives 504-508 other than the staging sub-drive 502.

The data flow possibilities into and between the sub-drives 502-508 of the non-volatile memory 500 are shown in FIG. 5 for one implementation. All host data 510 enters into the staging sub-drive 502 and no other sub-drive receives data directly from the host. When a garbage collection operation is initiated in the staging sub-drive 502, all valid data in the superblock or superblocks selected as source superblocks for the operation within the staging sub-drive 502 is transferred to one or more of the other sub-drives 504-508 along an appropriate one of data paths 512 from the staging sub-drive 502. The selection of the destination sub-drive 504-508 for each piece of valid data relocated from the staging sub-drive 502 is based on the temperature of LBA associated with the piece of data, as described in greater detail below. No open relocation superblocks are supported in the staging sub-drive 502 and thus no relocation of data back to another superblock within the staging sub-drive 502 is permitted in one implementation such that a garbage collection operation in the staging sub-drive 502 always results in valid data being relocated to another sub-drive 504-508.

In contrast, when a garbage collection operation is initiated in any other of the sub-drives 504-508, the valid data of the selected source superblock(s) from the identified sub-drive 504-508 may be relocated within the identified sub-drive or to any sub-drive other than the staging sub-drive, as indicated in relocation paths 514 and 516. Again, the individual pieces of valid data from a selected source block are moved to a particular sub-drive based on the determined temperature of the LBA associated with that piece of data.

Figure 6:
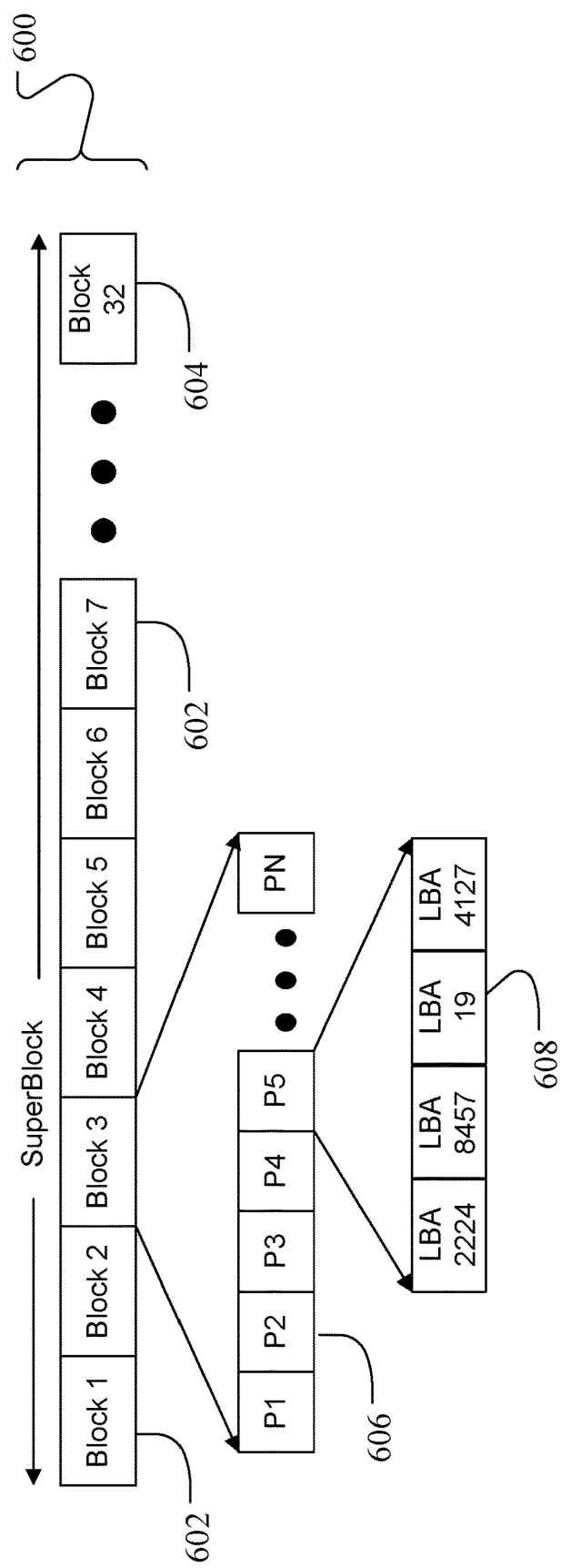
FIG. 6 illustrates is an example of a physical superblock of the non-volatile memory of FIG. 5 having multiple blocks that each have multiple pages and pieces of data associated with respective logical addresses.

Referring to FIG. 6, an example of a superblock 600 and its component parts is shown. As noted previously, a superblock 600 may be a fixed number of physical blocks 602 of data as well as one block 604 that contains exclusive or (XOR) data for every page of every other block 602 in the superblock 600. Each block 602 is comprised of a plurality of pages 606 that includes a plurality of pieces 608 of data. Each data piece 608 is an amount of data, for example a 4 Kbytes piece of data, that is associated with a logical block address (LBA). The LBAs shown in the example data pieces 608 of FIG. 6 are simply provided by way of example to show a situation where the data pieces 608 in a page 606 are associated with discontinuous LBAs.

Figure 7:
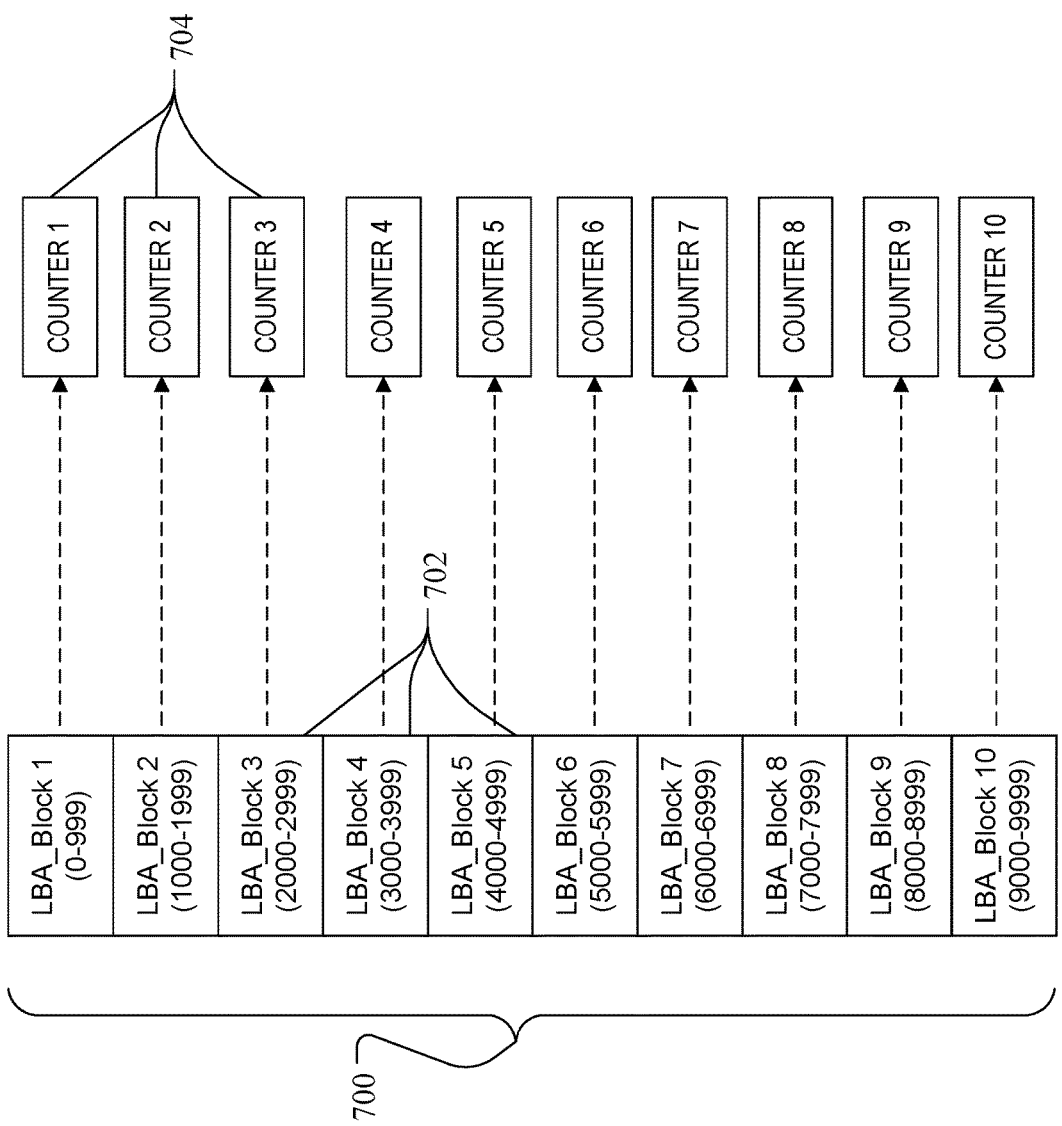
FIG. 7 illustrates the logical address space of the non-volatile memory system of FIGS. 2A-2B divided into LBA blocks, where each LBA block is a portion of the logical space, and a host hit counter associated with each respective LBA block.

Referring to FIG. 7, a logical address space 700 for the non-volatile memory die 104 of the NVM system 100 is shown. The sub-drive data routing module 112 of the controller 102 divides the full logical address space 700 into a predetermined number of LBA blocks 702, where each LBA block 702 represents a fixed number of contiguous LBAs. Simply for ease of illustration, a total logical address space 700 of 10,000 addresses (0-9999) is provided and each predetermined LBA block 702 consists of a different set of 1,000 contiguous LBAs. Also illustrated in FIG. 7 is a separate counter 704 associated with each LBA block 702. The counters 704 are maintained by the sub-drive data routing module to contain the number of host transactions over a predetermined amount of time that have occurred at any LBA encompassed by the LBA block 702 associated with the counter 704. The counters 704 may be stored as LBA block activity counters 117 in RAM 116 in the NVM system 100.

In one implementation, the controller 102, via the sub-drive data routing module 112, keeps track of all transactions for every LBA in a LBA block 702 for the life of the NVM system 100 and the counters 704 represent the cumulative transactions at each LBA in the respective LBA block 702 associated with the counter 704 since the device was last initialized. Thus, the predetermined amount of time within which the number of host transactions are tracked by each counter may be the entire life of the NVM system. In other implementations, the predetermined amount of time may refer to a fixed window of time that extends back a limited amount of time to the present, where the earlier LBA transaction counts are removed from the respective counters 704 in favor of more recent LBA transaction activity.

Figure 8A:
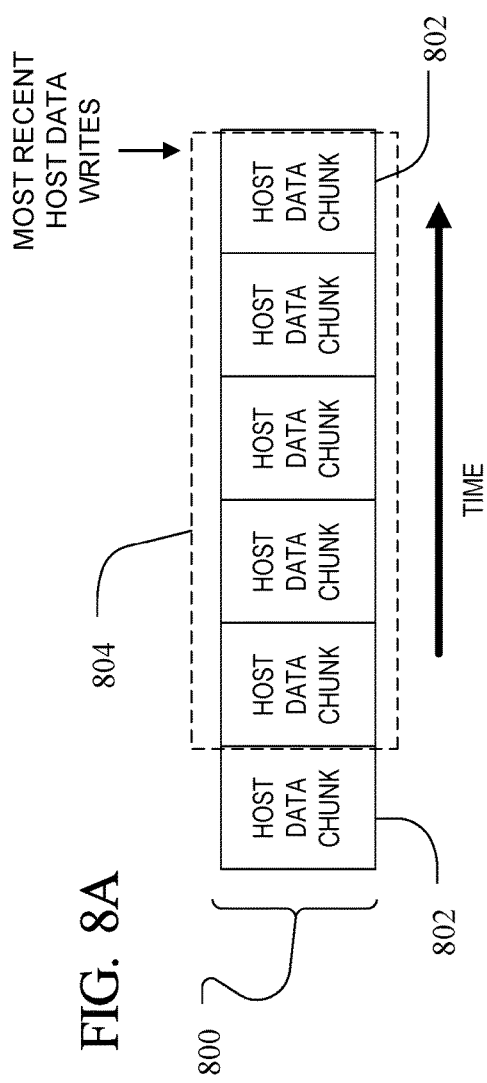
FIGS. 8A and 8B illustrate a monitoring window of most recently received host data that is used to determine current temperature of logical addresses in the non-volatile memory system.
Figure 8B:
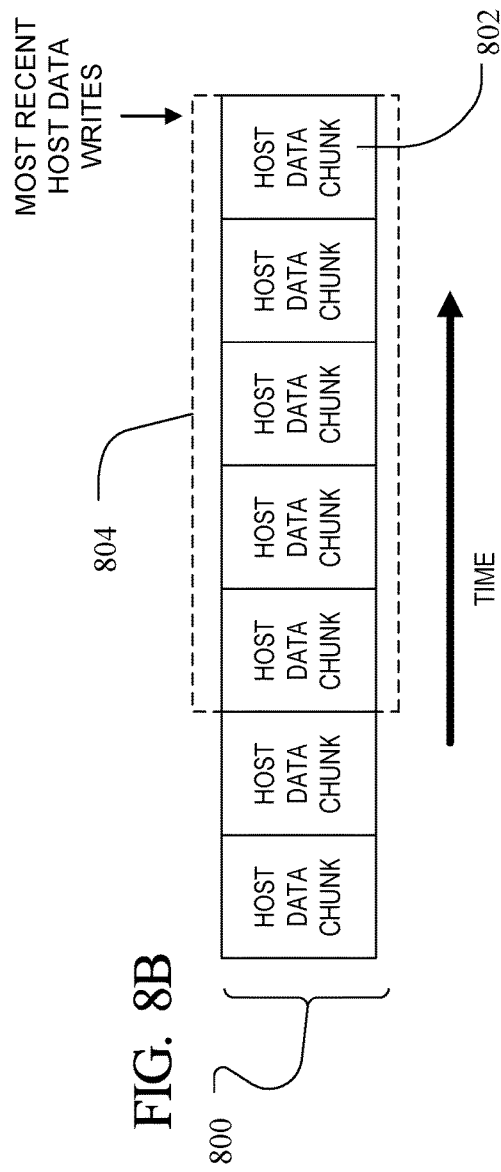

A visual representation of this sliding window of time within which the counters 704 include host activity at LBAs is shown in FIGS. 8A and 8B. In FIG. 8A, the incoming host data stream 800 is represented as predetermined amounts of host data, shown as host data chunks 802, that are accumulated over time. The host data chunk size may be a fixed and constant amount in one implementation. The controller 102 may look at a sliding window 804 of time, where the time is represented by the number of consecutive host data chunks 802 from the most recent to a predetermined number of host data chunks prior in time. Within this window 804, all of the host transactions for LBAs in the respective LBA blocks are tallied and included in the respective counter 704 for each LBA blocks 702. As shown in FIG. 8B, when a next host data chunk 802 has been accumulated, the window 804 slides to include the latest host data chunk 802 and the oldest host data chunk 802 previously in the widow is removed, representing that the LBA transaction counts associated with that now excluded host data chunk 802 are subtracted from the respective counters. In this manner, the temperature of LBAs may more accurately be reflected and older activity at LBAs is removed. The above technique and system for tracking and updating temperatures (host write activity) for LBA blocks is just one example and other LBA temperature tracking and update methods are contemplated.

The boundaries of the temperature ranges assigned to the sub-drives other than the staging sub-drive, such as the hot, medium and cold sub-drives 506,508, 510 in the example of FIG. 5, may be set to predetermined values at the time of manufacture or the controller 102 may use an adaptive algorithm to search for optimized temperature ranges to assign to each sub-drive 506, 508, 510 based on observed LBA block 702 temperature distributions.

Figure 9:
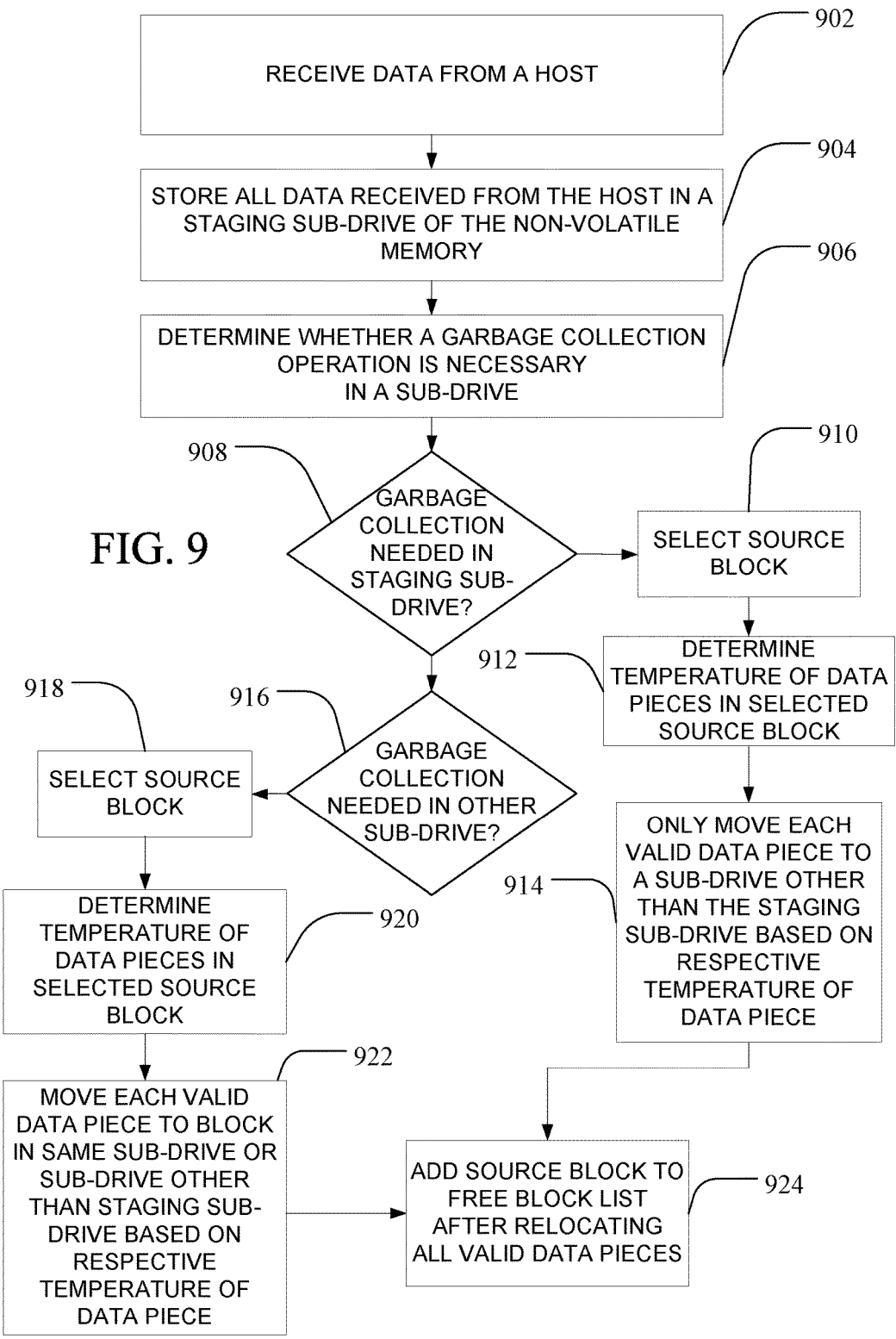
FIG. 9 is a flow diagram illustrating one implementation of managing data flow in a non-volatile memory such as shown in FIG. 5.

A method of utilizing the NVM system 100 with sub-drives and data structures described above is illustrated in FIGS. 9-11. Referring to FIG. 9, a flow chart describing an implementation of the data flow in sub-drives 502-508 of the non-volatile memory 500 is described. All data received from a host is received and the sub-drive data routing module 112 of the controller 102 only routes host data for storage at the staging sub-drive 502 (at 902, 904). As noted above, in one implementation only the staging sub-drive is configured with an open host write superblock to receive the host data and none of the other sub-drives are configured to receive host data directly such that no additional host write blocks need be maintained aside from the one in the staging sub-drive 502. Periodically, for example after every host write to the staging sub-drive, the controller 102 will determine whether a garbage collection operation is needed for any of the sub-drives 502-508 (at 906). One suitable garbage collection trigger may be the number of free blocks in the non-volatile memory 104 as a whole falling below a predetermined minimum value. If the controller 102 detects that too few free blocks are available based on the free block list 121, then a garbage collection operation may be initiated. The number of free blocks is just one example of a garbage collection trigger and different or additional garbage collection triggers are contemplated.

Once triggered, first steps in the garbage collection operation are to determine the sub-drive in the non-volatile memory 104 where the garbage collection operation is needed, and then to select a source superblock from that sub-drive. One sub-drive selection process is described in greater detail below. Regardless of the sub-drive and superblock selection process utilized, when the selected sub-drive is the staging sub-drive 502, a source superblock 600 is selected by the controller 102 and the temperature of each valid data piece 608 in each block 602 of the source superblock 600 is determined (at 910, 912). each valid piece of data from the selected source superblock 600 is then relocated from the staging sub-drive 502 to an appropriate other sub-drive 504-508 based on the temperature of the valid data piece and the temperature range assigned by the controller to the other sub-drives (at 914). The staging sub-drive does not include a relocation superblock and can only receive host data, thus all garbage collection activities regarding a superblock in the staging sub-drive result in the controller 102, via the sub-drive data routing module 112, transferring data out of the staging sub-drive 502 to relocation superblocks in other of the sub-drives 504, 506, 508.

When a garbage collection operation is determined to be necessary in a sub-drive other than the staging sub-drive 502, the controller 102 selects a source superblock 600 from the identified sub-drive and determines the temperature of valid data pieces 608 of the blocks 602 in that source superblock in the same manner as with a garbage collection operation in the staging sub-drive (at 918, 920). However, when each valid data piece 608 in the selected source superblock 600 is analyzed for relocation, the relocation may be to an open relocation superblock on the same sub-drive the source superblock was selected from, or the valid data piece may be relocated to any of the other sub-drives other than the staging sub-drive, based on the temperature comparison of valid data piece 608 to assigned sub-drive temperature ranges (at 922) that are tracked by the sub-drive data routing module 112.

In different implementations, the sub-drive temperature ranges for other than the staging sub-drive may be static and defined when the firmware executable by the controller 102 is compiled during manufacture, or they may be dynamic. For the case of dynamic temperature ranges, any of a number of known algorithms may be used to periodically analyze the distribution of LBA block temperatures to determine appropriate ranges for the sub-drives 504, 506, 508. Simply by way of example, the three ranges for the example sub-drive arrangement of FIG. 5 can be (i) for the hot sub-drive, access density is >5 accesses/LBA/drive write; (ii) for the medium sub-drive it may be 0.2<access density <5; and (iii) for the cold sub-drive, it may be <0.2 access/LBA/drive write. These example ranges of the number of accesses per LBA per drive write are just one example and other ranges are contemplated. In addition, the examples provided assume three sub-drives with three unique temperature ranges, however a greater or lesser number of drives and associated ranges may be utilized in other implementations.

Regardless of which sub-drive 502-508 is identified as needing the garbage collection operation, the valid data pieces 608 in the selected source superblock 600 may each be reviewed individually to determined data temperature and then transferred individually to the relocation superblock in the sub-drive that corresponds to the temperature range that includes the determined temperature for the valid data piece 608. Thus, different valid data pieces from a single selected source superblock may be relocated to different sub-drives in some instances. After all valid data pieces 608 from the selected source superblock 600 have been relocated, then the source superblock may be added to the free block list 121 maintained in RAM 116 (at 924). Superblocks 600 in the free block list 121 may be later used in any of the sub-drives as needed.

Figure 10:
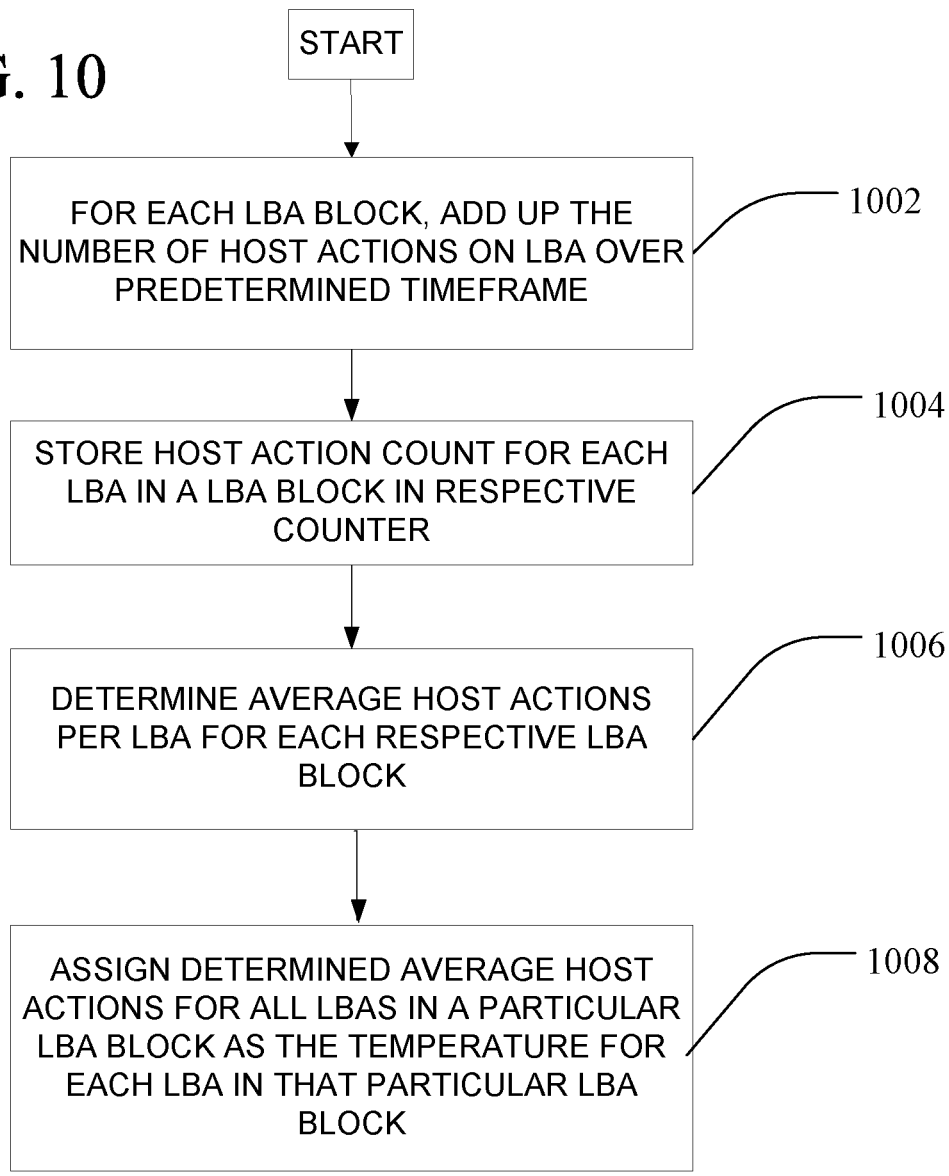
FIG. 10 is a flow diagram of one implementation for measuring a temperature of logical addresses associated with data that may be utilized in the data flow management process of FIG. 9.

FIG. 10 provides an example process of determining the temperature of LBAs associated with data pieces 608 in a selected source superblock. At the time that a source superblock is identified for a given garbage collection operation, the sub-drive data routing module 112 and controller 102 first determine a current temperature for each LBA block 702. To determine the temperature of an LBA block, the controller determines the cumulative number of host activities for each LBA (host write operations also referred to herein as "hits" on the LBA) in the LBA block 702 over a predetermined time period, such as the window 804 of previously received host data chunks 802 discussed in FIGS. 8A and 8B (at 1002). The controller 102 then stores the determined amount of LBA hits for all LBAs in each respective LBA block 702 in a respective one of the counters 704 in RAM 116 (at 1004). The controller 102 may then calculate the average number of hits per LBA by dividing the total hits by the number of LBAs in the LBA block (at 1006). Each LBA in the contiguous range of LBAs that make up an LBA block 702 is then assigned that average as representative of the temperature of the LBA (at 1008). This process of determination of LBA temperature may be separately made for all of the LBA blocks 702.

Thus, the granularity of temperature measurements is at the LBA block 702 level where all of the host write activity for all LBAs in a given LBA block 702 is averaged for the time window 804 and then the data at each LBA in that LBA block 702 is assigned that average as its temperature. It is contemplated that the length of the contiguous run of LBAs included in each LBA block 702 is constant and greater than one LBA in length, however each LBA block may be only one LBA in length, such that the exact temperature of each LBA may be determined in other embodiments. Larger LBA run lengths for the LBA blocks 702 can lessen the amount of overhead in terms of memory and processing needed to compute data temperatures while still permitting useful separation of data into different temperature groups for sorting during the relocation activity in a garbage collection operation.

Referring again to FIG. 9, (see steps 920 and 922 for garbage collection in a non-staging sub-drive, or steps 912 and 914 for garbage collection in the staging sub-drive) as valid data pieces 608 are then sequentially identified in the selected source superblock 600, the LBA associated with each valid data piece 608 is reviewed and the calculated temperature of the LBA block 702 within which that LBA falls is then assigned to the valid data piece. This determined temperature is then compared to the temperature thresholds of the hot, medium and cold sub-drives 504, 506, 508 and the sub-drive defining the range of temperatures within which the determined temperature falls is the sub-drive to which that particular valid data piece 608 is routed by the controller 102. That valid data piece 608 is written into the open relocation superblock 505, 507, 509 in the appropriate sub-drive 504, 506, 508 and the process moves on to the next valid data piece 608 until all valid data pieces 608 are moved from the selected source superblock 600.

The decision as to whether a particular sub-drive 502, 504, 506, 508 requires a garbage collection operation to free up additional space in that sub-drive may be based on target over-provisioning thresholds for each of the different sub-drives 502-508. Overprovisioning, as used herein, refers to the amount of physical space in non-volatile memory greater than the amount of logical address space. The total amount of overprovisioning for the entire non-volatile memory 104 may be preset at manufacture, and based on current host access density (also referred to herein as data temperature), such as write activity, may be distributed among the sub-drives as respective target overprovisioning thresholds. The target overprovisioning thresholds for each sub-drive in the non-volatile memory, as described in greater detail below, are determined based on the current logical capacity occupied by valid data in each sub-drive and the current write traffic (also referred to herein as workload) in each sub-drive. The NVM system 100, through these variable target overprovisioning settings, takes advantage of the pattern of data movement between sub-drives driven by the data temperature boundaries assigned the sub-drives to help avoid write amplification for "hotter" (higher update frequency) data. For example, the NVM system 100 may be configured at manufacture to include a predetermined amount of minimum physical capacity overprovisioning for the system as a whole and then divide up the logical capacity as desired among the sub-drives where a sub-drive associated with a data type having a higher likelihood of update is allocated a larger capacity overprovisioning than a sub-drive associated with a data type having a lower frequency of update.

As noted above, the non-volatile memory 104 of the NVM system 100, as a whole, may be manufactured with an overprovisioning amount such that there is a predetermined extra physical capacity (e.g. extra physical superblocks) greater than the predetermined total logical capacity. Each sub-drive in the NVM system possesses a variable portion of the NVM system's logical capacity based on the flow of data into the staging sub-drive and then into each other sub-drive based on predetermined data temperature thresholds for each sub-drive. Also, for a given window of time, such as window 804 (FIG. 8) that is based on a most recent set of data chunks 802 received, a percentage workload (W) may be determined for each sub-drive. The workload is a measurement of host access density to LBAs (e.g. the host write activity directed to LBAs) in the sub-drives. In one implementation, workload may be defined as the total number of hits (e.g. write operations) at each LBA in a sub-drive over a designated window time period and the percentage workload for a sub-drive is that total number of hits divided by all hits at any LBA in the whole NVM system during the window 804. Thus, although related to temperature of data as described above, the workload takes into account the exact number of hits at each LBA in a sub-drive rather than an average number of hits at LBAs in a given LBA block being assigned to all LBAs in the LBA block. Based on the current logical capacity, current workload and the total overprovisioning of the entire NVM system, the controller 102 via the sub-drive routing module 112 can calculate a target overprovisioning to optimize the physical overcapacity for each sub-drive. Finally, by selecting a superblock for garbage collection from a sub-drive that currently is above its respective calculated target overprovisioning amount, the overprovisioning can be adjusted. Thus, the overprovisioning of each sub-drive may be determined based on the workflow (i.e., access density in terms of the number of host writes) and selection of a superblock for a garbage collection operation may be made based on the relative overprovisioning status of each sub-drive.

Figure 11:
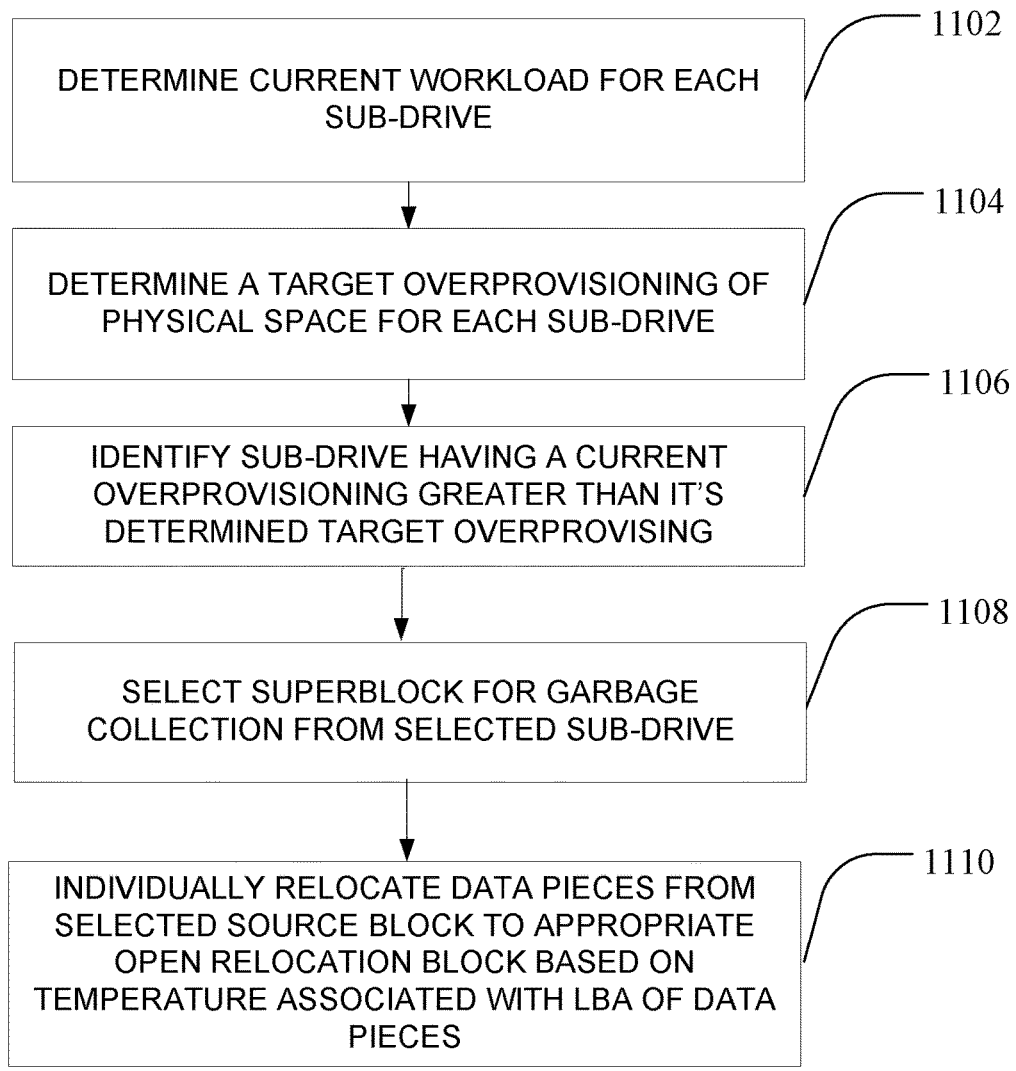
FIG. 11. is a flow diagram illustrating a process for determining the sub-drive in the non-volatile memory from which to select a source block for garbage collection and for then sorting the valid data from the selected source block to different sub-drives during the garbage collection operation.

FIG. 11 illustrates a process for selecting a source superblock for a garbage collection operation after a garbage collection trigger has been detected. The current workload for each sub-drive is calculated by the controller 102 (at 1102) and then a target overprovisioning desired for each sub-drive may be calculated based on that determined workload (at 1104). One example of a calculation of target overprovisioning is set out in more detail below. Once the target overprovisioning levels are determined for the different sub-drives, the controller can then compare the current amount of overprovisioning of each sub-drive to the respective target overprovisioning that has been calculated. The controller may then identify a sub-drive having an actual overprovisioning amount greater than the calculated target overprovisioning and select a superblock from that identified sub-drive as the source block for a garbage collection operation (at 1106, 1108). As noted above, the process of sorting valid data from the selected source block into appropriate relocation blocks in the different sub-drives according to the temperature of that valid data may then take place via the garbage collection operation (at 1110).

In one implementation, the target overprovisioning (OP) calculation used to determine what sub-drive to use for selecting a superblock for a garbage collection operation may be determined by first looking at a current total logical capacity for each sub-drive. To arrive at a normalized logical capacity, the current total logical capacity of valid data in a sub-drive may be divided by the total logical capacity of the non-volatile memory 104. Then, for each sub-drive, the controller 102 tracks the host write activity in terms of percentage workload (W) targeted to each sub-drive. The workload W may be calculated as a moving average, over the window of most recent data writes such as illustrated in FIGS. 8A and 8B, of the percent of write activity, where the unit of measurement for each host data chunk 802 may be in terms of logical capacity or physical capacity. In one implementation, because all host data is written to the staging sub-drive before being sorted and relocated to a different sub-drive during garbage collection, the write activity for each LBA is considered to belong to the sub-drive that last contained valid data for that LBA. In this manner, a value for workload W may be calculated for each sub-drive despite the fact that all data is actually being written by the host into the staging sub-drive.

Once the logical capacity (hereinafter "D") and W are known, the target overprovisioning for each sub-drive can be determined and, from that determination, the sub-drive from which a source superblock will be selected for garbage collection identified. With respect to the target overprovisioning of physical space to logical space, any of a number of algorithms may be used. One suitable algorithm may be: target overprovisioning (Target OP)=$(D_i+W_i)\times$Total OP/($2\times D_i$), where Total OP is the total overprovisioning for all sub-drives in the non-volatile memory 104, i represents the particular sub-drive number, the sum of $D_i$ for all i is 1 ($\Sigma D_i=1$) and the sum of W for all i is 1 ($\Sigma W_i=1$).

So, for a non-volatile memory 104 where the total overprovisioning is set to 30% (i.e. 30% more physical space than total logical address space assigned to the non-volatile memory) and that has three sub-drives in the following state:

| Sub-drive number | Pre-assigned logical capacity | Current measured workload (W) |
|---|---|---|
| 0 | 10% | 80% |
| 1 | 30% | 10% |
| 2 | 60% | 10% | the target OP for sub-drive 0 would be $(0.1+0.8)\times0.3/(2\times0.1)=1.35$ or 135%, target OP for sub-drive 1 is $(0.3+0.1)\times0.3/(2\times0.3)=0.20$ or 20% and target OP of sub-drive 3 is $(0.6+0.1)\times0.3/(2\times0.6)=0.175$ or 17.5%. The target physical capacity (C) for each sub-drive may then be calculated by the controller 102 as: $C_i=D_i\times(1+\text{Target OP}_i)$, where i is the sub-drive number. In this example, $C_0$ would be $0.1\times(1+1.35)=0.235$ or 23.5%; $C_1$ would be $0.3\times(1+0.20)=0.36$ or 36%; and $C_2$ would be $0.6\times(1+0.175)=0.705$ or 70.5%. The sum of the target OP values for all of the sub-drives in this example is then 23.5%+36&+70.5%=130% which matches the 100% logical capacity+30% total OP for the drive. This simplified example only looked at a system with three total sub-drives, however it may be extended to any number of sub-drives in different implementations.

Once the target overprovisioning numbers for each sub-drive are determined based on current logical capacity and current workload information, then the controller may select a sub-drive from which to select a source block for garbage collection. In one implementation, the controller 102 is configured to select the sub-drive (staging sub-drive or temperature range assigned sub-drive) that currently has an amount of overprovisioning of physical space that is greater than its currently calculated target overprovisioning. If more than one sub-drive is at an overprovisioning level that is greater than it's respective target overprovisioning level, then the sub-drive with the greatest amount over its target overprovisioning may be selected. The source superblock for garbage collection that is selected from that selected sub-drive may then be chosen using any of a number of known criteria, such as the superblock having the least amount of valid data, the superblock least recently written to, or other criteria alone or in combination. Accordingly, when a garbage collection operation trigger is detected in this hypothetical arrangement of three sub-drives, the controller 102 may use the current logical capacities (D), the current workloads (W) and the total overprovisioning of the non-volatile memory to determine a target OP for each sub-drive that may be used to find the sub-drive from which to select a source superblock for garbage collection. Also, although the examples above discuss selection of a source superblock and sorting valid data from the source superblock into various destination superblocks during garbage collection based on data temperature, in other implementations the data handling size may instead be at the metablock level (superblock without the parity block) or other block grouping sizes down to the individual minimum erase block size.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two-dimensional memory structure or a three-dimensional memory structure.

In a two dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three-dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two-dimensional and three-dimensional exemplary structures described but cover all relevant memory structures within the spirit and scope of the invention as described herein and as understood by one of skill in the art.

Methods and systems have been disclosed for managing received data through a common staging sub-drive and sorting data by temperature upon initiation of a garbage collection operation to multiple other sub-drives in non-volatile memory. The system and method permit reduction of the number of open host write blocks, and reduction of the associated overhead such as maintaining extra protection for power loss, by routing all initial host writes for storage into a designated staging sub-drive such that only a single open host write block is needed in the non-volatile memory system. Write amplification may be reduced by then identifying LBA temperatures and sorting individual valid data pieces directly to a respective other sub-drive associated with the temperature range of a valid data piece. Overprovisioning thresholds for each of the sub-drives may be maintained via the garbage collection process. The direction of relocated data flow may be limited exclusively to and between all sub-drives except the staging sub-drive, where data in the staging sub-drive may only be relocated to other sub-drives while data in the other sub-drives may be relocated within the same or other sub-drive aside from the staging sub-drive.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A method for managing data in a memory system having a controller in communication with a plurality of non-volatile memory sub-drives, the method comprising the controller:
   receiving host data writes at the memory system;
   storing all data associated with the received host data writes only at a staging sub-drive of the plurality of sub-drives;
   only moving data from the staging sub-drive to another sub-drive as part of a garbage collection operation to free additional space in the staging sub-drive.

2. The method of claim 1, further comprising:
   determining, based on a garbage collection trigger, whether a garbage collection operation is necessary for the staging sub-drive; and
   executing the garbage collection operation when the garbage collection operation is determined to be necessary.

3. The method of claim 2, wherein the garbage collection trigger comprises a number of free blocks in the plurality of sub-drives falling below a predetermined threshold.

4. The method of claim 3, wherein the free blocks comprise free superblocks.

5. The method of claim 1, further comprising only maintaining an open write superblock for receiving host data on the staging sub-drive and only maintaining an open relocation superblock on each of the plurality of sub-drives in the memory system other than the staging sub-drive.

6. The method of claim 2, wherein executing the garbage collection operation comprises selecting a superblock in the staging sub-drive as a source block for relocation and relocating each valid data piece in the selected superblock to a sub-drive other than the staging sub-drive, wherein each valid data piece is relocated directly from the staging sub-drive to a respective one of the other sub-drives based on a determined temperature of the data in each valid data piece.

7. The method of claim 6, further comprising determining a temperature of a valid data piece based on an average temperature of a logical block address (LBA) block that includes a logical block address of the valid data piece, wherein the average temperature of the LBA block comprises an average number of host actions on logical block addresses included in the LBA block.

8. The method of claim 7 wherein the host actions comprise host writes.

9. A method for managing data, the method comprising: in a memory system having a controller and plurality of non-volatile memory sub-drives including a staging sub-drive configured to receive all initial data writes from a host and plurality of additional sub-drives each associated with data of a different predetermined temperature range, the controller:
  selecting one of the plurality of non-volatile memory sub-drives for a garbage collection operation;
  selecting a source superblock for the garbage collection operation in the selected one of the plurality of sub-drives, the selected source superblock having valid data pieces each associated with a respective logical address;
  for each valid data piece in the selected source superblock, determining a temperature of the logical address associated with the valid data piece; and
  moving the valid data piece to the non-volatile memory sub-drive containing data associated with logical addresses having the determined temperature.

10. The method of claim 9, wherein the selecting one of the plurality of non-volatile memory sub-drives comprises selecting a sub-drive that has a current overprovisioning greater than a target overprovisioning for the sub-drive, wherein overprovisioning comprises a ratio of physical space in the sub-drive to an amount of valid data in the sub-drive.

11. The method of claim 9, wherein determining the temperature comprises determining an amount of host activity previously directed to a logical address associated with the valid data piece.

12. The method of claim 11, wherein determining the temperature further comprises determining the amount of host activity previously directed to the logical address over a predetermined time.

13. The method of claim 12, wherein the memory system comprises a logical address space divided into a plurality of predetermined contiguous logical address blocks, and wherein determining the temperature comprises determining an average amount of host activity previously directed to a contiguous logical block address block containing a logical address of the valid data piece and associating the determined average amount of host activity to the logical address.

14. The method of claim 9, wherein when the selected sub-drive comprises the staging sub-drive, only moving each valid data piece to a sub-drive other than the staging sub-drive.

15. The method of claim 9, wherein when the selected sub-drive comprises a sub-drive other than the staging sub-drive, only moving each valid data piece to a sub-drive other than the staging sub-drive.

16. A non-volatile memory system comprising:
  a non-volatile memory having a plurality of sub-drives; and
  a controller in communication with the plurality of sub-drives, the controller configured to:
    only route data received from a host to a staging sub-drive;
    select from the plurality of sub-drives a sub-drive having more than a target amount of overprovisioning for the sub-drive, wherein the target amount of overprovisioning comprises a ratio of physical storage capacity to valid data in the sub-drive;
    select a source superblock from the selected sub-drive for a garbage collection operation;
    execute the garbage collection operation on the selected source superblock, wherein to execute the garbage collection operation, the controller is configured to only relocate valid data pieces of the selected source superblock to sub-drives other than the staging sub-drive based on a data temperature range associated with the sub-drives other than the staging sub-drive and a data temperature determined for each valid data piece.

17. The non-volatile memory system of claim 16, further comprising:
  a plurality of logical block address (LBA) blocks, each LBA block defining a unique contiguous range of LBAs;
  a plurality of host activity counters, each host activity counter associated with a respective one of the plurality of LBA blocks; and
  wherein for each of the plurality of host activity counters the controller is further configured to track a host activity count for all host activity at LBAs associated with a respective LBA block.

18. The non-volatile memory system of claim 17, wherein to determine a data temperature of a valid data piece, the controller is configured to:
  determine an average host activity count for each LBA block; and
  assign the valid data piece, as the data temperature, the average host activity count of an LBA block containing the LBA associated with the valid data piece.

19. The non-volatile memory system of claim 17, wherein the controller is configured to track the host activity count for all host activity over a predetermined time period at LBAs associated with the respective LBA block.

20. The non-volatile memory system of claim 17, wherein the non-volatile memory comprises a substrate formed with a three-dimensional memory structure.

21. A non-volatile memory system comprising:
  a non-volatile memory comprising:
    a staging sub-drive configured to receive all host data from a host; and
    a plurality of temperature range sub-drives other than the staging sub-drive, each of the plurality of temperature range sub-drives associated with a respective different data temperature range;
  and means for selecting a source superblock for a garbage collection operation from one of the staging sub-drive or plurality of temperature range sub-drives based on a target overprovisioning for each sub-drive and for only relocating valid data from the selected source superblock to sub-drives other than the staging sub-drive based on a data temperature range associated with the sub-drives other than the staging sub-drive and a data temperature determined for each valid data piece in the selected source superblock.

* * * * *